United States Patent [19]

Bergemont

[11] Patent Number: 5,449,633
[45] Date of Patent: Sep. 12, 1995

[54] METHOD FOR FABRICATING AN ULTRA-HIGH-DENSITY ALTERNATE METAL VIRTUAL GROUND ROM

[75] Inventor: Albert Bergemont, Santa Clara, Calif.

[73] Assignee: National Semiconductor Corporation, Santa Clara, Calif.

[21] Appl. No.: 327,319

[22] Filed: Oct. 21, 1994

Related U.S. Application Data

[60] Division of Ser. No. 274,675, Jul. 13, 1994, which is a continuation of Ser. No. 11,955, Feb. 1, 1993, abandoned.

[51] Int. Cl.⁶ .......................................... H01L 21/265
[52] U.S. Cl. ...................................... 437/48; 437/50; 437/52; 437/250
[58] Field of Search ................ 437/48, 52, 60, 47, 437/50, 51, 250

[56] References Cited

U.S. PATENT DOCUMENTS

| | | | |
|---|---|---|---|
| 5,002,896 | 3/1991 | Naruke | 437/48 |
| 5,111,428 | 5/1992 | Liang et al. | 365/104 |
| 5,151,375 | 9/1992 | Kazerounian et al. | 437/43 |
| 5,204,835 | 4/1993 | Eitan | 365/185 |
| 5,241,497 | 8/1993 | Komarek | 365/104 |
| 5,372,961 | 12/1994 | Noda | 437/45 |

FOREIGN PATENT DOCUMENTS

| | | |
|---|---|---|
| 03179775 | 8/1991 | Japan . |
| 04158572 | 6/1992 | Japan . |

OTHER PUBLICATIONS

Okada, M. et al., "16Mb Rom Design Using Bank Select Architecture", Symposium on VLSI Circuits–Digest of Technical Papers 1988, Tokyo, Japan, pp. 85–86.

Primary Examiner—Olik Chaudhuri
Assistant Examiner—H. Jey Tsai
Attorney, Agent, or Firm—Limbach & Limbach; H. Donald Nelson; Richard J. Roddy

[57] ABSTRACT

The present invention provides an alternate metal virtual ground (AMG) read only memory (ROM) array formed in a silicon substrate of P-type silicon. The array includes a ROM cell matrix which is defined by a plurality of rows and a plurality of columns of ROM data storage cells. The AMG ROM array includes a plurality of parallel, spaced-apart buried N+ bit lines formed in the silicon substrate. Alternate buried N+ bit lines are contacted by a conductive metal line at two contact locations within an array segment to thereby define contacted drain bit lines of the ROM cell matrix. Each buried N+ bit line that is between two adjacent contacted drain bit lines is non-contacted. Each non-contacted bit line is segmented into a length sufficient to form the segmented source bit line for a preselected plurality of ROM data storage cells, thereby defining a column of the ROM data storage cells in the ROM segment. That is, a first column of ROM data storage cells is connected between the segmented source bit line and the first adjacent contacted drain bit line. A second column of ROM data storage cells is connected between the segmented source line and the second adjacent contacted drain bit line.

1 Claim, 8 Drawing Sheets

METHOD FOR FABRICATING AN ULTRA-HIGH-DENSITY ALTERNATE METAL VIRTUAL GROUND ROM

This is a divisional of application Ser. No. 08/274,675, filed Jul. 13, 1994, which was a file wrapper continuation of application Ser. No. 08/011,955, filed Feb. 1, 1993, now abandoned.

BACKGROUND OF THE INVENTION

1. Field of the Invention The present invention relates to read only memory (ROM) devices and, in particular, to a ROM array that incorporates alternate metal virtual ground (AMG) memory array architectural concepts to provide ultra-high-density read only data storage.

2. Discussion of the Prior Art U.S. Pat. No. 5,151,375 issued to Boaz Eitan on Sep.29, 1992 for EPROM VIRTUAL GROUND ARRAY, discloses an alternate metal virtual ground (AMG) EPROM array. The basic idea of the Eitan disclosure is the use of a "cross-point" EPROM cell, i.e. a cell that is defined by the perpendicular crossing of a poly1 floating gate island and a poly2 word line in an array in which metal contacts alternate buried N+ bit lines. The contacted bit lines define the drain lines of the array, while the intermediate noncontacted bit lines define the source lines of the array. The source bit lines connect to ground via access transistors. Each drain bit line is contacted only once every 64 cells, the 64 cells connected to the same drain bit line constituting one "segment."

Turning now from AMG EPROM array concepts to ROM array concepts, which are the subject of the present invention, Okada et al., "16Mb ROM Design Using Bank Select Architecture", 1988 Symposium on VLSI Circuits; Digest of Technical Papers, 1988, p. 85-6, disclose a high density mask ROM array based on a bank selection architecture. Referring to FIG. 1, each ROM cell bank "n" in the Okada et al. array consists of sixteen word lines (WL0-WL15). The buried bit lines 2 in each bank are connected to aluminum lines 4 via bank select transistors 6. The alternating main bit lines M and virtual ground bit lines V are utilized in pairs to read data from the ROM storage cells 8.

As further shown in FIG. 1, the Okeda et al. ROM uses two types of bank select transistors. One type is used for reading ROM cells in "even" columns of the array. The other type is used for reading "odd" columns.

Referring to FIG. 2, when a selected R0M cell in an even column is accessed (e.g. the circled cell in FIG. 2), the selected word line WL0 and the bank select line $SE_n$ for the even columns both go high; the bank select line $SO_n$ for the odd columns goes low. As a result, the drain and source regions of the selected ROM cell are connected to the main bit line M and to the virtual ground line V, respectively. At the same time, the sources and drains of the ROM cells in the odd columns are shorted via the even columns bank select transistors which are activated by the even columns bank select line $SE_n$.

Cells in odd columns are similarly accessed in accordance with the bias conditions shown in FIG. 3.

Referring back to FIG. 1, the alternating main bit lines M and virtual ground lines V run zigzag in the column direction of the array, alternately connecting the shorted nodes in the even and odd columns in adjacent ROM cell banks. Thus, the pitch of the aluminum lines 4 can be twice that of the buried N+ bit lines 2. This reduces both the capacitance and the possibility of shorts between the aluminum lines 4. It also allows cell size to be determined by the minimum pitch of the bit lines 2 rather than by the pitch of the aluminum lines 4.

SUMMARY OF THE INVENTION

The present invention provides an alternate metal virtual ground (AMG) read only memory (ROM) array formed in a silicon substrate of P-type silicon. The array includes a ROM cell matrix which is divided into a number of segments each of which is defined by a plurality of rows and a plurality of columns of ROM data storage cells. Each AMG ROM array segment includes a plurality of parallel, spaced-apart buried N+ bit lines formed in the silicon substrate. Alternate buried N+ bit lines are contacted by a conductive metal line at first and second contact locations in each segment to thereby define contacted drain bit lines of the ROM cell matrix. Buried N+ bit lines located between two contacted drain bit lines are non-contacted. Each non-contacted bit line is segmented into a length sufficient to form the segmented source bit line for a preselected plurality of ROM data storage cells, thereby defining a column of ROM data storage cells in the array segment. That is, a first column of ROM data storage cells is connected between the segmented source bit line and a first adjacent contacted drain bit line. A second column of ROM data storage cells is connected between the segmented source line and a second adjacent contacted drain bit line. For each contacted drain bit line, one of a pair of segment select switching transistors is respectively connected between the contacted drain bit line and one of the two contact locations for that contacted drain bit line. The segment select switching transistors are responsive to a segment select signal for enabling current flow between the contacted drain bit line and the contact locations. For each segmented source bit line, one of a pair of inner select switching transistors is respectively connected between one of the ends of the segmented source bit line and the adjacent contacted drain bit line associated with that segmented source bit line. The inner select switching transistors are responsive to an inner select signal for enabling current flow between the segmented source bit line and the adjacent contacted drain bit line. Similarly, one of a pair of outer select switching transistors is respectively connected between one of the ends of the segmented source bit line and the second adjacent contacted drain bit line. The outer select transistors are responsive to an outer select signal for enabling current flow between the segmented source bit line and the second adjacent contacted bit line.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 1:
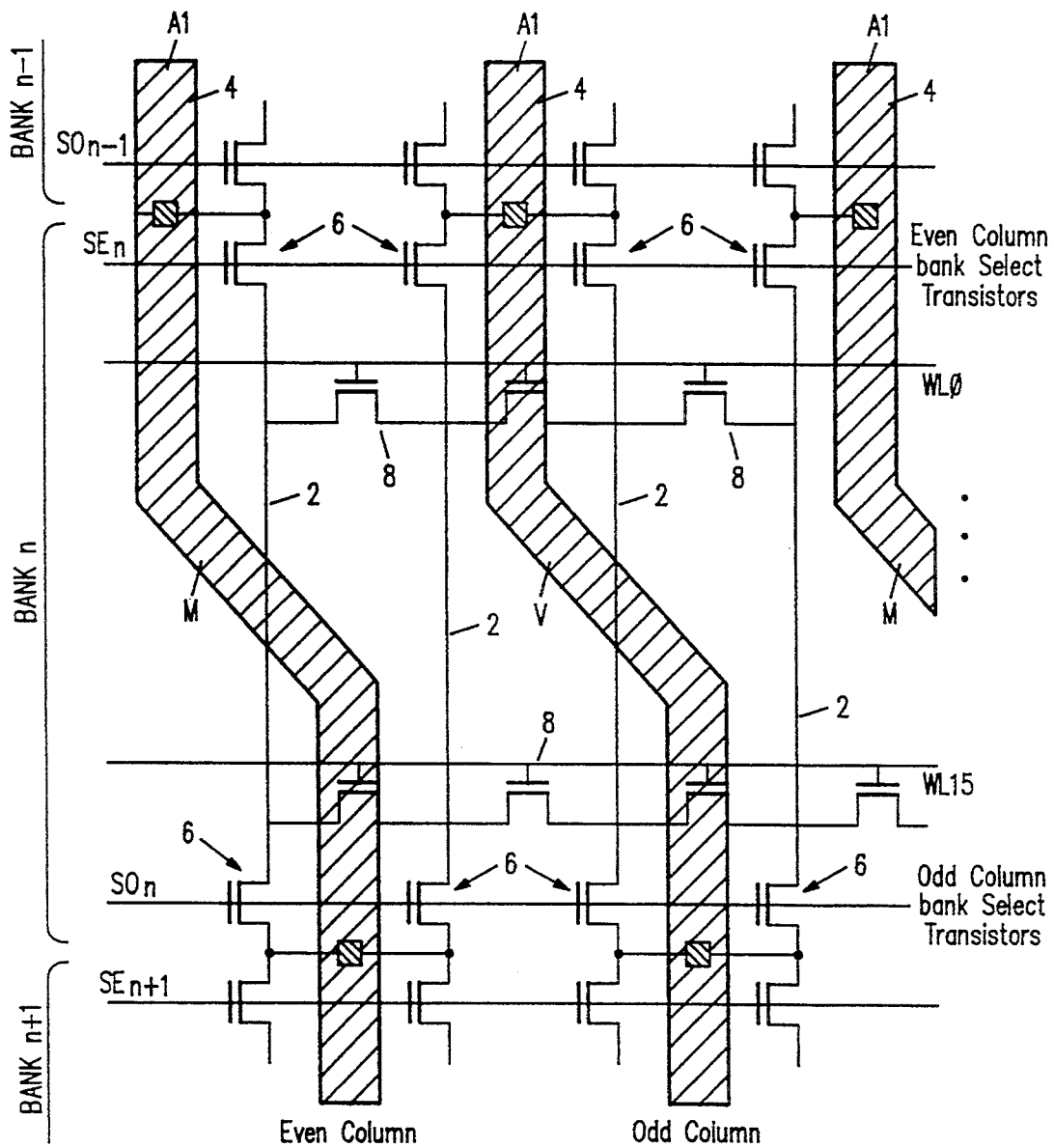
FIG. 1 is a layout drawing illustrating a known mask ROM array based on a bank select architecture.
Figure 2:
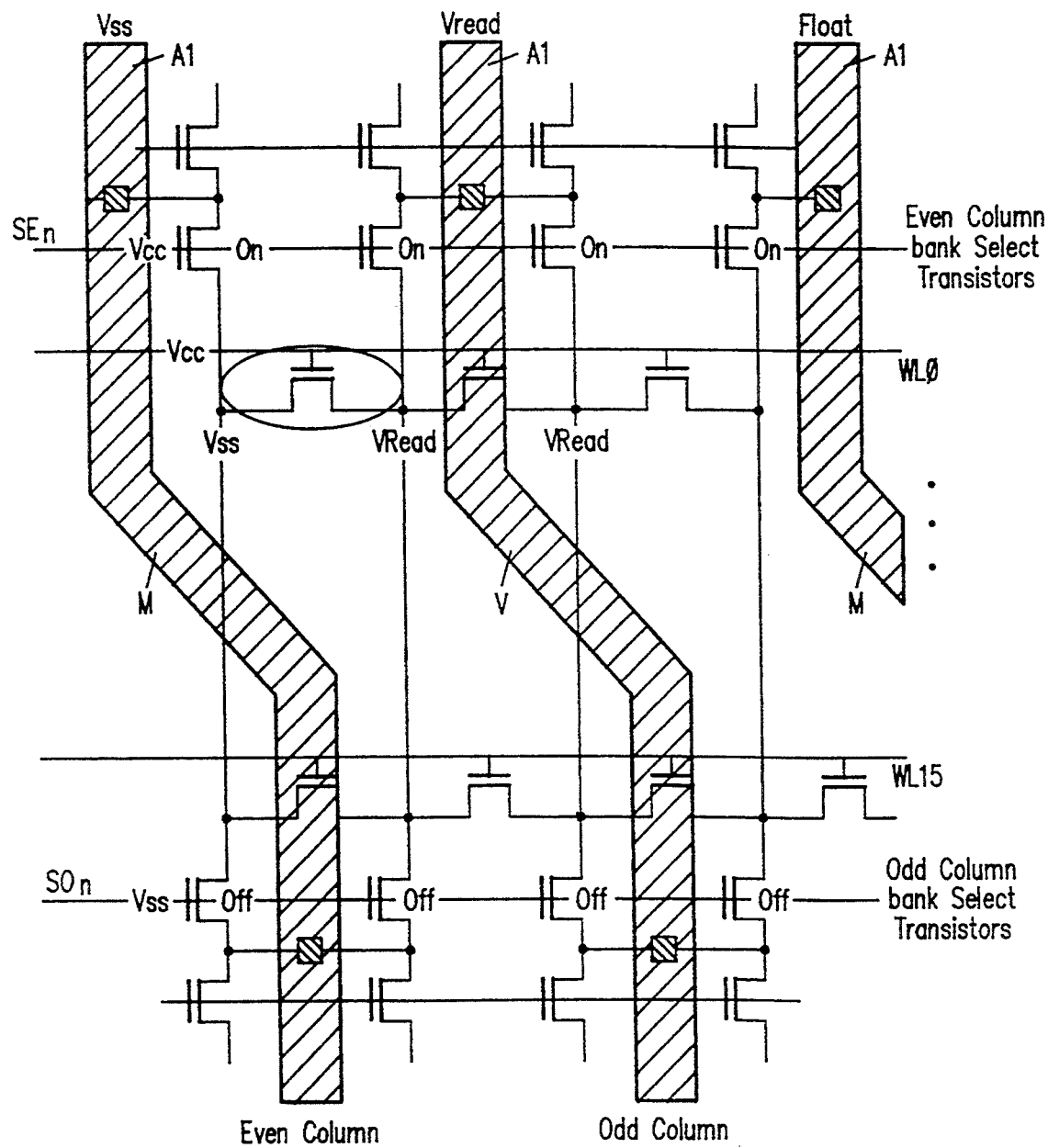
FIG. 2 is a layout drawing illustrating bias conditions for reading a selected cell in an even column in the FIG. 1 array.
Figure 3:
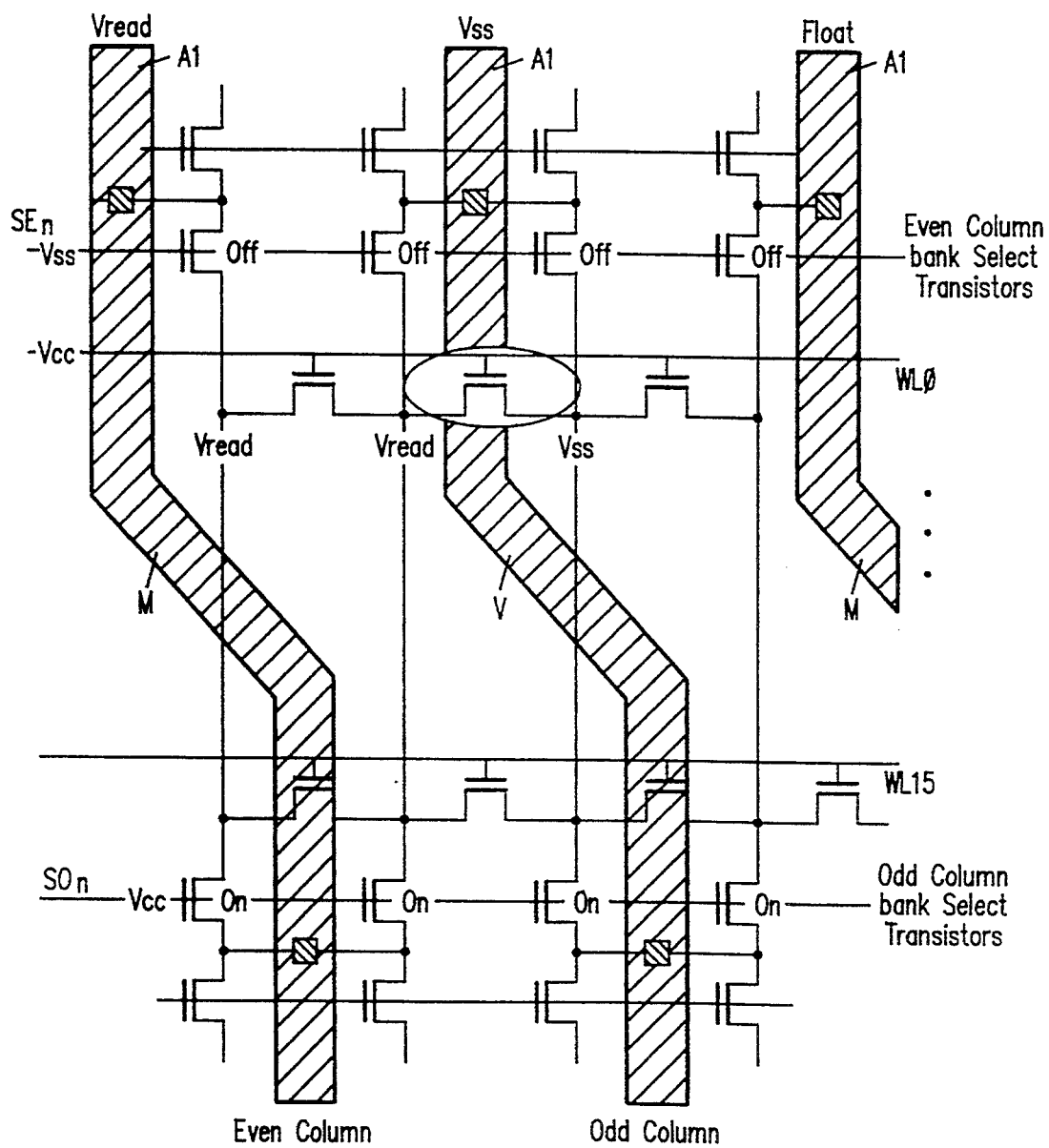
FIG. 3 is a layout drawing illustrating bias conditions for reading a selected cell in an odd column of the FIG. 1 array.
Figure 4:
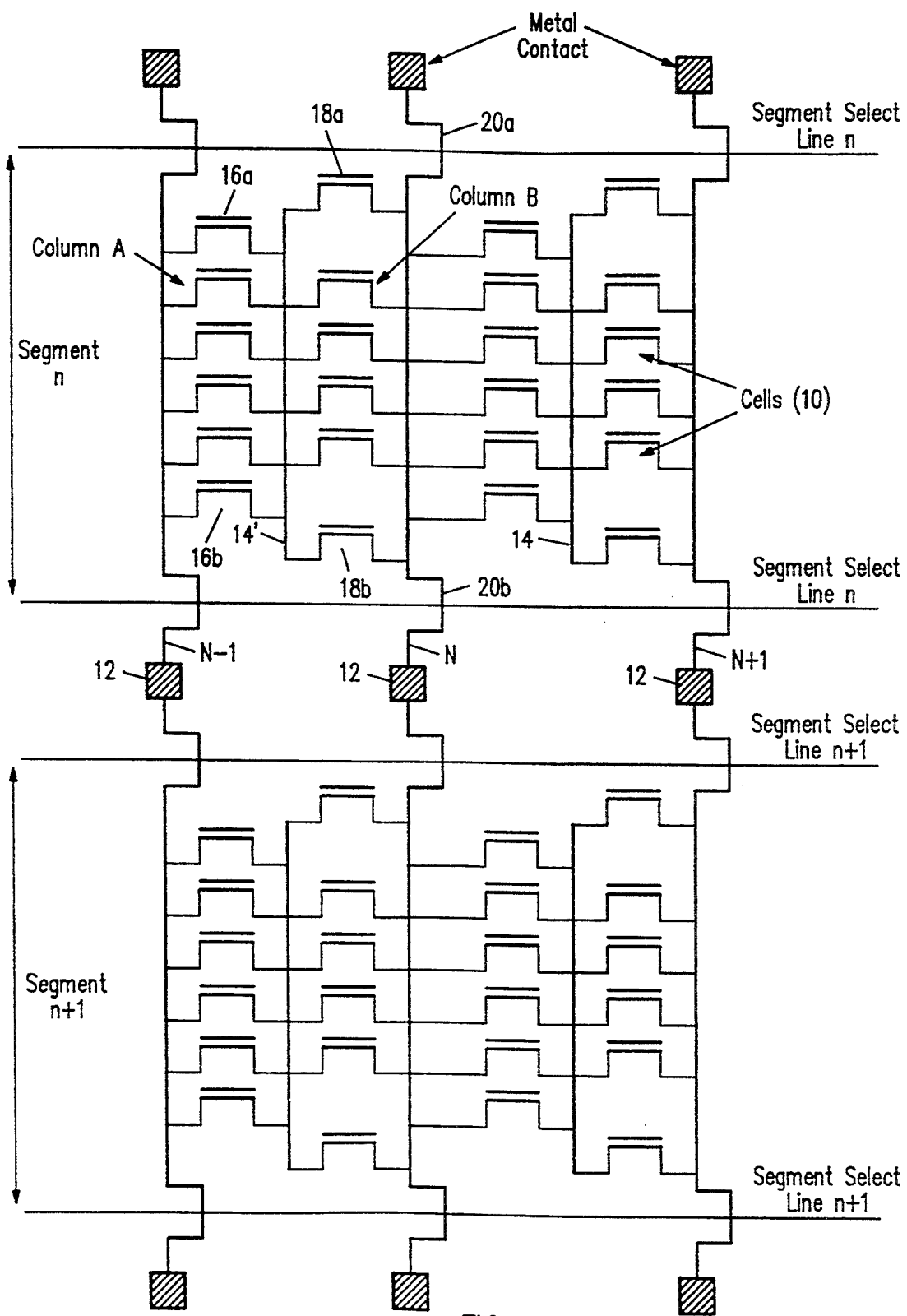
FIG. 4 is a schematic drawing illustrating portions of two segments (n and n+1) of an AMG ROM array in accordance with the present invention.

FIG. 4 shows portions of two segments n and n+1 of an alternate metal virtual ground (AMG) read only memory (ROM) array in accordance with the present invention.

As shown in FIG. 4, each segment (e.g. segment n) of the AMG ROM array includes a ROM cell matrix defined by intersecting rows and columns of ROM data storage cells 10. The ROM storage cells 10 are connected between N+ diffusion bit lines. Alternate bit lines are electrically contacted by a conductive metal (typically aluminum) line (not shown) contact locations 12 between each of the segments of the array. These alternating, contacted bit lines, i.e. bit lines N−1, N and N+1 in FIG. 4, define the drain bit lines of the AMG ROM array.

The remaining N+ bit lines, i.e. the bit lines between the contacted drain bit lines N−1, N and N+1, are non-contacted and, further, are segmented into a length sufficient to form the source bit line 14 for a preselected number, typically 32 or 64, of ROM data storage cells 10. These storage cells define a column within a segment of the AMG ROM array.

More specifically, with reference to segmented source bit line 14′ in FIG. 4, for each segmented source bit line in the AMG ROM array, a first column A of ROM data storage cells 10 is connected between segmented source bit line 14′ and one of the contacted drain bit lines, drain bit line N−1 in this case, that is adjacent to source bit line 14′. A second column B of ROM data storage cells 10 is connected between segmented source bit line 14′ and the other adjacent contacted drain bit line, drain bit line N in this case.

Furthermore, with continuing reference to segmented source bit line 14′, for each segmented source bit line in the AMG ROM array, there are two inner select switching transistors (16a, 16b) connected between the respective ends of the segmented source bit line 14′ and one of the adjacent contacted drain bit lines, bit line N−1 in this case As discussed in greater detail below, each of the pair of inner select switching transistors (16a, 16b) is responsive to an inner select signal for enabling current flow between the segmented source bit line 14′ and the adjacent drain bit line N−1.

In addition, there are two outer select switching transistors (18a, 18b) connected between the respective ends of the segmented source bit line 14′ and the other adjacent contacted drain bit line N. As discussed in greater detail below, each of the outer select switching transistors (18a, 18b) is responsive to an outer select signal for enabling current flow between segmented source bit line 14′ and the other adjacent drain bit line N.

In the preferred embodiment of the invention, and as shown in FIG. 4, both the inner select switching transistors (16a, 16b) and the outer select switching transistors (18a, 18b) are unprogrammed ROM data storage cells similar to the cells 10 utilized in the AMG ROM cell array matrix.

As further shown in FIG. 4, and with reference to contacted drain bit line N, for each contacted drain bit line, each one of a pair of segment select switching transistors (20a, 20b) is respectively connected between the contacted drain bit line N and one of the two contact locations 12 for drain bit line N in segment n of the AMG ROM array. As described in greater detail below, each of the segment select switching transistors (20a, 20b) is responsive to a segment select signal for enabling current flow between the contacted drain bit line N and the conductive contact line (not shown) associated with drain bit line N.

A process for fabricating an AMG ROM array in accordance with the invention will now be described.

Figure 5:
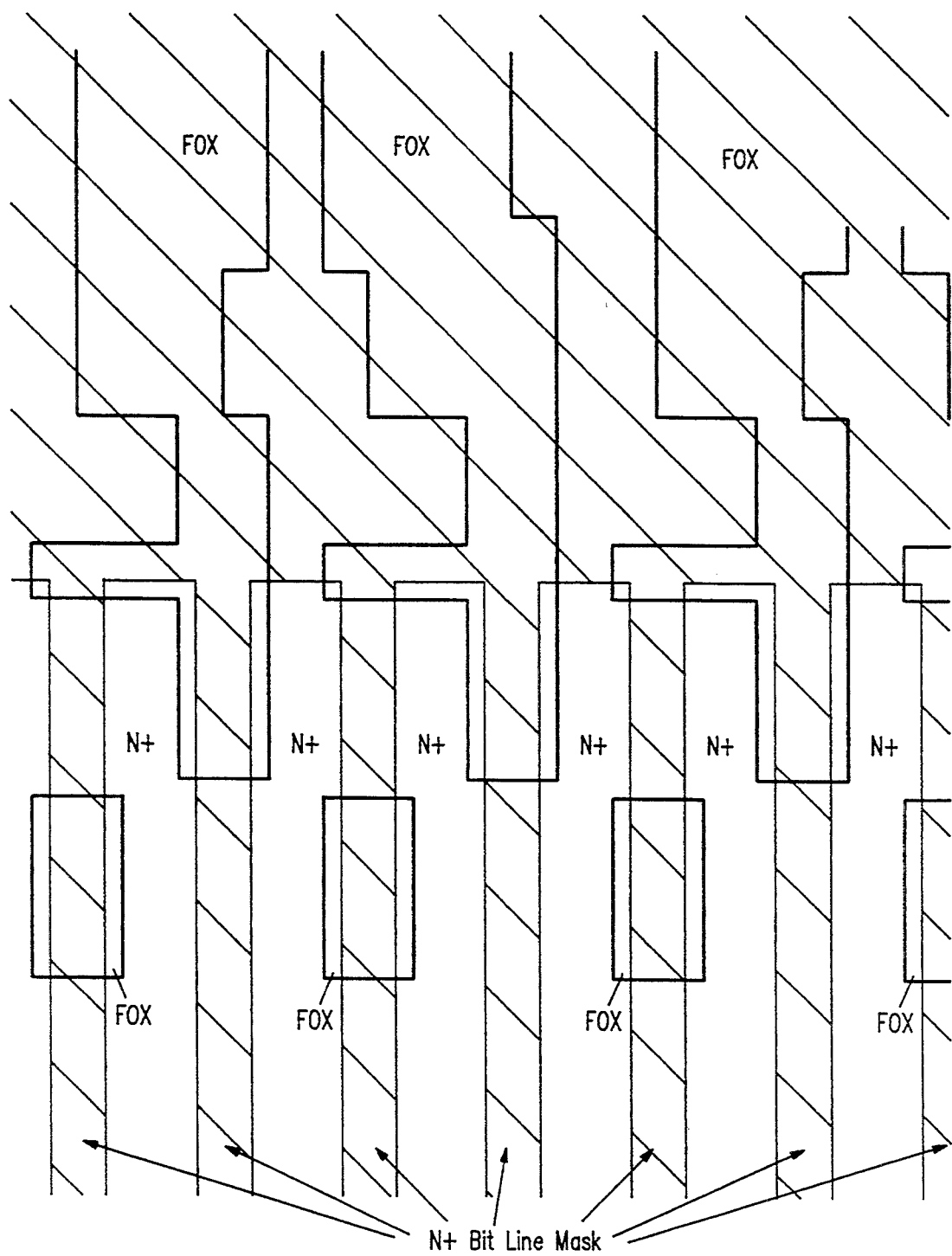
FIG. 5 is a layout drawing illustrating the formation of an N+ bit line mask in a process of fabricating an AMG ROM array in accordance with the present invention.

The AMG ROM array is fabricated in a silicon substrate of P-type conductivity. Referring to FIG. 5, conventional LOCOS techniques are used to define field oxide (FOX) regions in the P-type substrate as desired. The oxide/nitride/oxide (ONO) formed as part of the LOCOS procedure is then removed from the substrate and a layer of sacrificial oxide is formed. An N+ bit line photoresist mask is then formed and patterned to define the N+ buried bit lines and to protect the segment select transistor portion of the array. This is followed by an arsenic ion implant step to form parallel, spaced-apart N+ buried bit lines in the P-type silicon substrate. The photoresist N+ bit line mask is then stripped.

Figure 6:
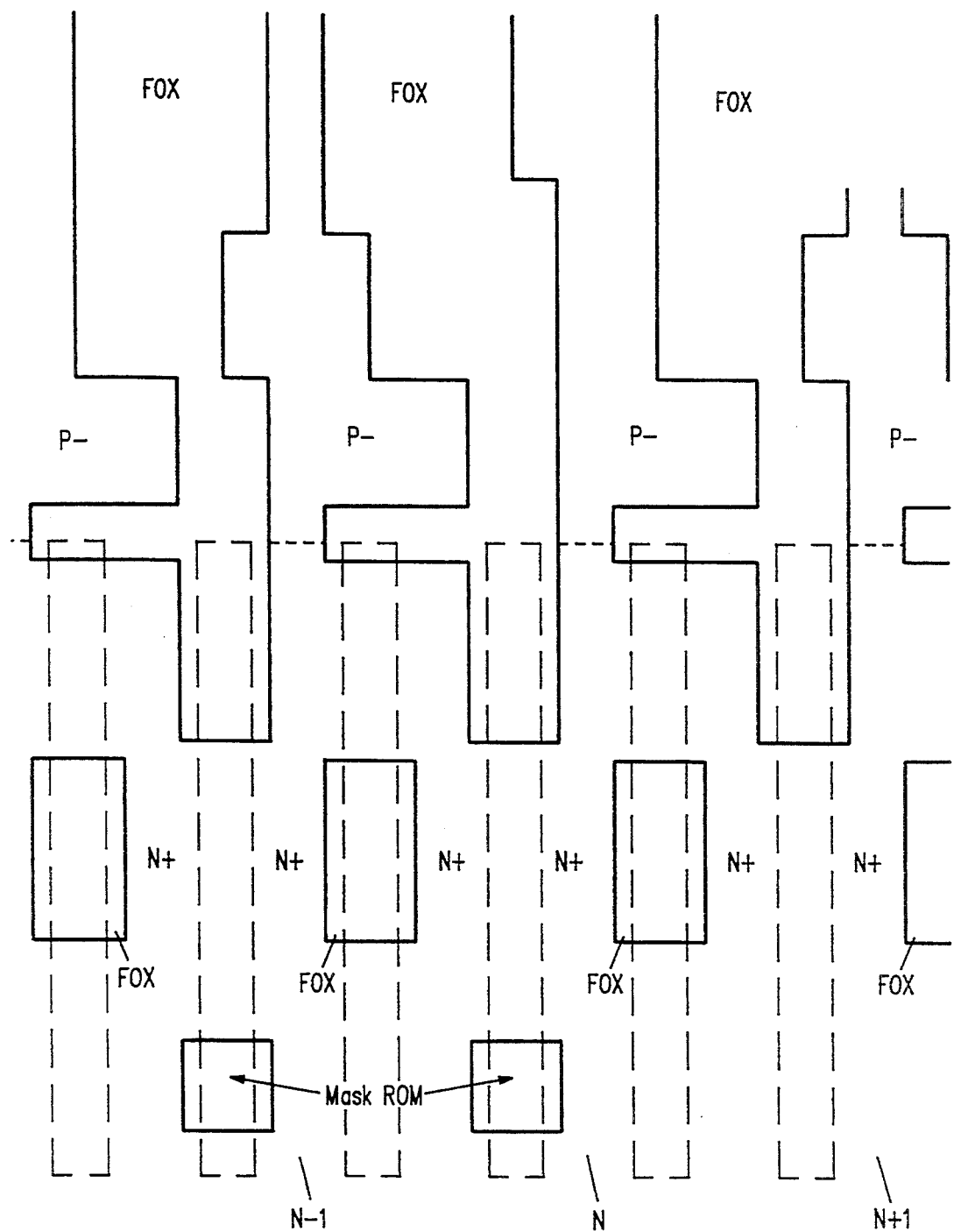
FIG. 6 is a layout drawing illustrating the formation of a ROM programming mask in a process of fabricating an AMG ROM array in accordance with the present invention.

As shown in FIG. 6, a photoresist ROM programming mask is then formed and patterned to expose those regions of the substrate which are to be the programmed channels of the ROM data storage cells 10. A boron ion implant is then performed to set the threshold voltage level of the programmed cells. The photoresist programming mask is then stripped and the sacrificial oxide is removed.

Figure 7:
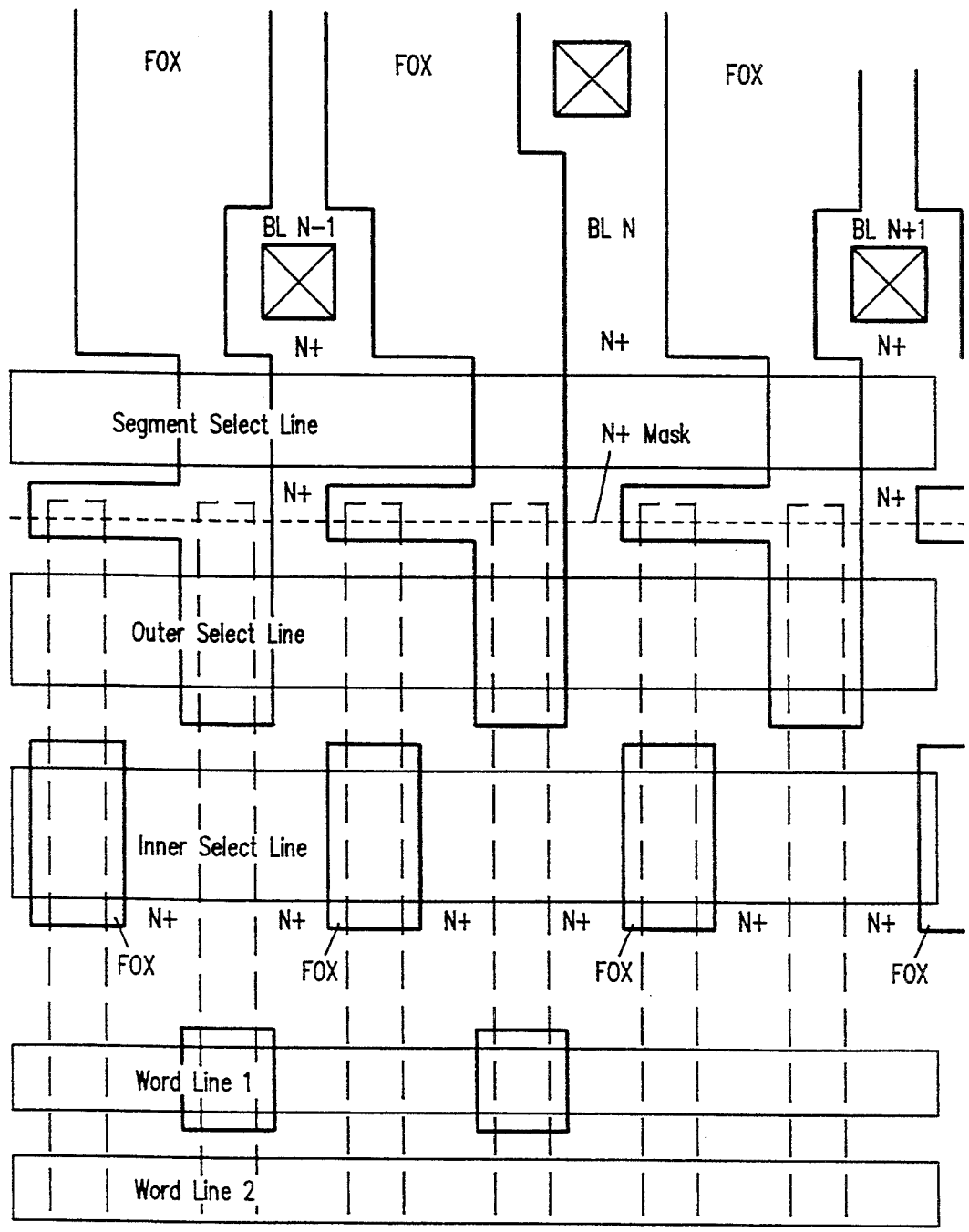
FIG. 7 is a layout drawing illustrating the structure of a portion of an AMG ROM array fabricated in accordance with the present invention.

Referring to FIG. 7, a layer of gate oxide about 100–300 Å thick is then grown and a layer of polycrystalline silicon is formed over the gate oxide. A photoresist polysilicon mask is then formed and patterned and the polysilicon is etched to define the following spaced-apart, parallel strips of polysilicon, all of which run perpendicular to the N+ buried bit lines: (i) one segment select line formed at the top (as shown in FIG. 7) and one segment select line formed at the bottom of each AMG ROM segment to provide the gate electrodes of the segment select switching transistors (20a, 20b); (ii) one outer select line formed at the top (as shown in FIG. 7) and one outer select line formed at the bottom of each segment to provide the gate electrodes of the outer select transistors (18a, 18b); (iii) one inner select line formed at the top (as shown in FIG. 7) and one inner select line formed at the bottom of each segment to provide the gate electrodes of the inner select transistors (16a, 16b); and (iv) one word line for each row (FIG. 7 shows word lines for rows 1 and 2) in that segment to provide the gate electrodes for the ROM data storage cells 10 in that row.

The photoresist polysilicon mask is then stripped and an N+ photoresist mask is formed to enable formation of the N+ source and drain regions of the segment select transistors and the connection between the N+ drain bit lines and the segment select transistors. That is, the N+ mask is formed to provide an overlap between the N+ drain bit lines N−1 N and N+1 and the N+ implant, self-aligned to the polysilicon segment line, for formation of the N+ source/drain regions of the segment select transistors.

Fabrication then continues for formation of the contents and completion of the AMG ROM array in accordance with conventional processing techniques.

Figure 8:
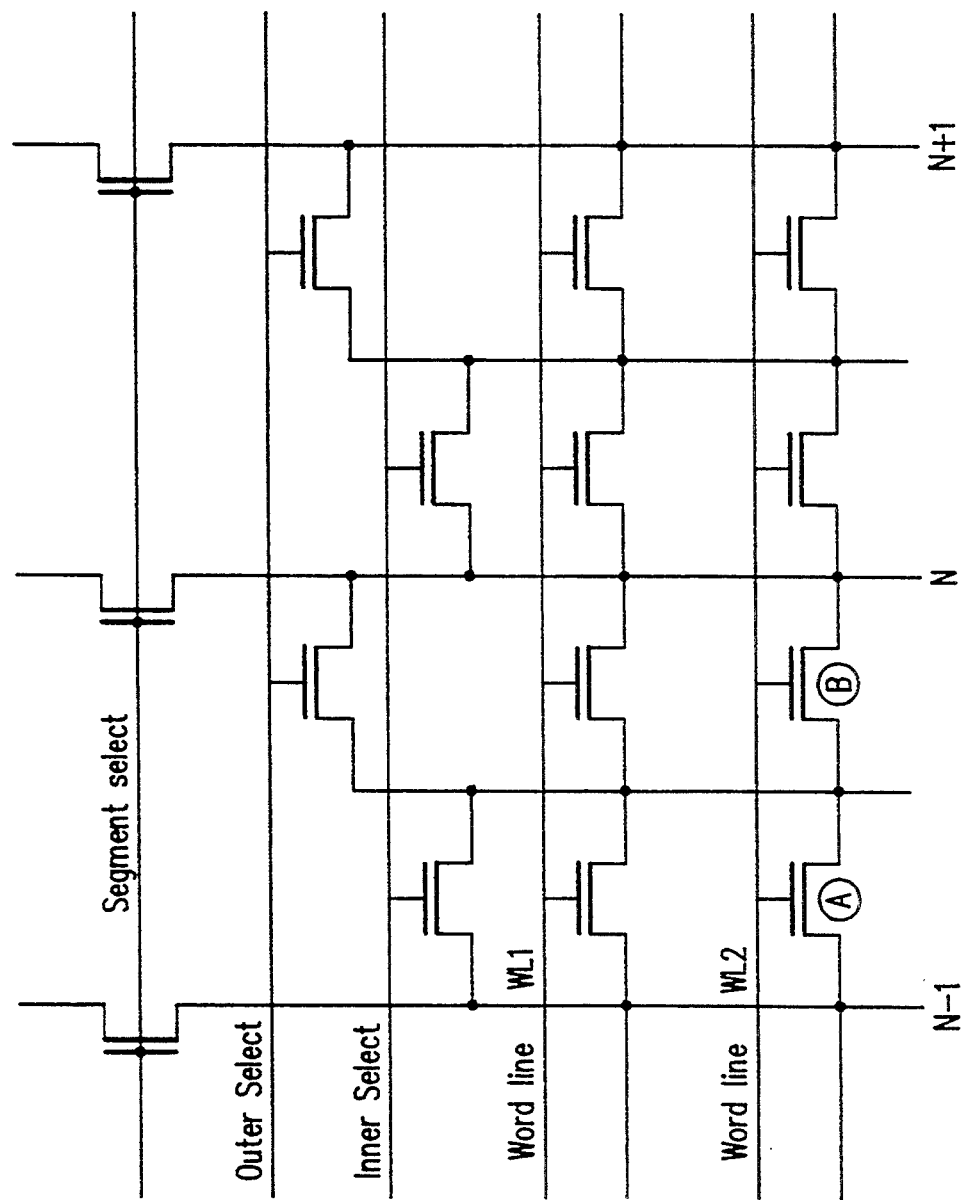
FIG. 8 is a schematic drawing illustrating greater detail of the segment select and outer/inner select switching features of a segment in an AMG ROM array in accordance with the present invention.

FIG. 8 shows a circuit equivalent of the FIG. 7 layout.

To read cell A in FIG. 8, the segment select lines for that segment are brought to the positive supply voltage Vcc, as are the outer select lines and word line WL2. The inner select lines and all other word lines in the segment are held at ground. A read voltage Vr is applied to precharge all drain bit lines N−1, N and N+1. Then, drain bit line N is grounded to read cell A.

Similarly, to read cell B in FIG. 8, the segment lines are brought to the supply voltage Vcc, as are the inner select lines and word line WL2. The outer select lines and all other word lines in the segment are held at ground. A read voltage Vr is applied to precharge all drain bit lines N−1, N and N+1. Then, drain bit line N−1 is grounded to read cell B.

The read bias conditions for cells A and B are summarized in Table I below.

TABLE I

| Read   | N-1 | N   | N+1 | Outer Select | Inner Select | WL1  | WL2 |
|--------|-----|-----|-----|--------------|--------------|------|-----|
| Cell A | Vr  | Vss | Vr  | Vcc          | Vss          | Vss  | Vcc |
| Cell B | Vss | Vr  | Vr  | Vss          | Vcc          | Vss  | Vcc |

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method of fabricating an alternate metal virtual ground (AMG) read only memory (ROM) array in a silicon substrate of P-type conductivity, wherein the array includes a ROM cell matrix that is divided into a plurality of segments, each segment defined by a plurality of rows and a plurality of columns of ROM data storage cells. The fabrication method comprising:

forming a plurality of parallel, spaced apart buried N+ bit lines in the silicon substrate; introducing P-type dopant into those portion of the silicon substrate which are to be programmed channels of programmed ROM data storage cells in the array;

forming a layer of gate oxide on the silicon substrate;

forming a layer of polysilicon on the gate oxide layer;

etching the polysilicon layer to define the following spaced-apart, parallel strips of polysilicon, all of which run perpendicular to the N+ buried bit lines: (i) one segment select line formed at the top and one segment select line formed at the bottom of each segment to provide gate electrodes of segment select switching transistors, (ii) one outer select line formed at the top and one outer select line formed at the bottom of each segment to provide gate electrodes of outer select transistors, (iii) one inner select line formed at the top and one inner select line formed at the bottom of each segment to provide gate electrodes of inner select transistors, and (iv) one word line for each row of ROM data storage cells in that segment to provide gate electrodes for said ROM data storage cells, and wherein the outer select lines, the inner select lines and the word lines overly the N+ bit lines and are separated therefrom by gate oxide, and wherein the segment select lines overly P-type substrate material and are separated therefrom by gate oxide;

introducing N-type dopant into the substrate to define N+ source and drain regions of the segment select transistors and to connect segment select transistors to corresponding N+ drain bit lines; and forming a plurality of conductive contact lines such that each alternating buried N+ bit line is contacted by a corresponding conductive contact line at first and second contact locations in each segment to thereby define contacted drain bit lines of the array, each non-contacted buried N+ bit line being segmented into a length sufficient to form a segmented source bit line for a preselected plurality of ROM data storage cells thereby defining a column of ROM data storage cells in the array segment;

such that, for each contacted drain bit line, one of a pair of segment select switching transistors is respectively connected between the drain bit line and one of the two contact locations for that contacted drain bit line, and such that, for each segmented source bit line, one of a pair of inner select switching transistors is respectively connected between one of ends of the segmented source bit line and first adjacent contacted drain bit line associated with said segmented source bit line, and such that, for each segmented source bit line, one of a pair of outer select switching transistors is respectively connected between and of the ends of the segmented source bit line and a second adjacent contacted drain bit line associated with said segmented source bit line.

* * * * *